United States Patent
Beach et al.

(10) Patent No.: US 7,135,753 B2
(45) Date of Patent: Nov. 14, 2006

(54) STRUCTURE AND METHOD FOR III-NITRIDE MONOLITHIC POWER IC

(75) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 51 days.

(21) Appl. No.: 11/004,186

(22) Filed: Dec. 3, 2004

(65) Prior Publication Data

US 2005/0121729 A1   Jun. 9, 2005

Related U.S. Application Data

(60) Provisional application No. 60/527,612, filed on Dec. 5, 2003.

(51) Int. Cl.
*H01L 29/00* (2006.01)

(52) U.S. Cl. .................. 257/501; 257/506; 257/513

(58) Field of Classification Search ........ 257/499–501, 257/506, 509, 510, 513, 373, 374
See application file for complete search history.

(56) References Cited

U.S. PATENT DOCUMENTS

| | | | | |
|---|---|---|---|---|
| 5,304,833 A | * | 4/1994 | Shigeki et al. | 257/372 |
| 5,512,774 A | * | 4/1996 | Nakagawa et al. | 257/501 |
| 5,536,961 A | * | 7/1996 | Nakagawa et al. | 257/374 |
| 6,969,893 B1 | * | 11/2005 | Shibata et al. | 257/368 |

\* cited by examiner

*Primary Examiner*—Hung Vu
(74) *Attorney, Agent, or Firm*—Ostrolenk, Faber, Gerb & Soffen, LLP

(57) ABSTRACT

III-nitride materials are used to form isolation structures in high voltage ICs to isolate low voltage and high voltage functions on a monolithic power IC. Critical performance parameters are improved using III-nitride materials, due to the improved breakdown performance and thermal performance available in III-nitride semiconductor materials. An isolation structure may include a dielectric layer that is epitaxially grown using a III-nitride material to provide a simplified manufacturing process. The process permits the use of planar manufacturing technology to avoid additional manufacturing costs. High voltage power ICs have improved performance in a smaller package in comparison to corresponding silicon structures.

16 Claims, 2 Drawing Sheets

STRUCTURE AND METHOD FOR III-NITRIDE MONOLITHIC POWER IC

RELATED APPLICATION

The present application is based on and claims benefit of U.S. Provisional Application No. 60/527,612, filed Dec. 5, 2003, entitled Monolithic High Voltage/High Power Integrated Circuit in Wide Band Gap Semiconductors to which a claim of priority is hereby made, and the disclosure of which is hereby incorporated herein by reference.

BACKGROUND OF THE INVENTION

1. Field of the Invention

The present invention relates generally to an isolation technique for devices constructed with high band gap materials, and relates more particularly to a III-nitride device and method for isolation in monolithic power IC.

2. Description of Related Art

III-nitride semiconductors are presently known that exhibit a large dielectric breakdown field of greater than 2.2 MV/cm. III-nitride heterojunction structures are also capable of carrying extremely high currents, which makes devices fabricated in the III-nitride material system excellent for power applications.

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HEMT devices. Due to the nature of the AlGaN/GaN interface, and the formation of the 2DEG at the interface, devices that are formed in the III-nitride materials system tend to be nominally on, or depletion mode devices. The high electron mobility of the 2DEG at the interface of the AlGaN/GaN layers permits the III-nitride device, such as a HEMT device, to conduct without the application of a gate potential.

One of the advantages attained with power semiconductor devices for manufacturing purposes is the ability to produce compact structures on a single wafer or on a single die. A number of III-nitride devices can be formed on a given wafer or die to speed production and increase efficiency. When the devices are formed on a wafer or die, they are isolated from each other to provide proper independent operation. Accordingly, it would be desirable to produce a number of III-nitride power devices on a single wafer or die with some type of insulation or isolation between the devices.

A drawback of III-nitride devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer such as an insulator, for example, and makes device isolation problematic.

One solution to provide isolation is to add insulation barriers around the device to produce the desired isolation. Typical layers used for this purpose are silicon oxide, silicon nitride, saphire, or other insulators, disposed between devices. However, these processes and structures are difficult to implement and are not always commercially feasible.

Materials in the III-nitride material system may include Gallium, Aluminum and Indium, as well as their nitrides, GaN, AiN and InN. Gallium nitride (GaN) and its alloys such as aluminum gallium nitride (AlGaN), indium gallium nitride (InGaN) and indium aluminum gallium nitride (InAIGaN) are also included in this material system. These materials are semiconductor compounds that have a relatively wide direct bandgap that permits highly energetic electronic transitions to occur. Gallium nitride materials have been formed on a number of different substrates including silicon carbide (SiC), saphire and silicon. Silicon substrates are readily available and relatively inexpensive, and silicon processing technology has been well developed.

Another solution to attain isolation in a III-nitride semiconductor device is through the use of a dielectric. For example, in silicon semiconductors, native oxides are available, such as silicon dioxide, that can serve as a suitable dielectric. However, no equivalent material to the native oxides in silicon is available for suitable dielectrics in the III-nitride material system. Dielectric materials that would otherwise be suitable in silicon semiconductors, for example, do not transfer well to III-nitride devices. Typically, the large dielectric breakdown field produced in the III-nitride material system causes large electric fields in the III-nitride semiconductor devices that are greater than can be withstood with conventional dielectric materials. For example, if silicon dioxide or silicon nitride were to be used for a dielectric in a III-nitride device, these conventional dielectrics may rupture or otherwise fail.

High voltage isolation of devices or components on a substrate or die is known in which different portions of the semiconductor structure are built to have a voltage well, where the device is constructed in the well and, voltage isolated to a particular voltage level. These isolation wells may be formed with a number of barrier structures to prevent leakage from one potential well to another, but such structures are often complicated and expensive to manufacture. For example, isolation of low voltage logic functions from high voltage switching functions often accomplished through junction isolation or dielectric isolation. Junction isolation is less than ideal because the IC is usually operating in a high temperature environment, which causes unacceptably high leakage currents due to thermal generation of carriers. With dielectric isolation, silicon does not provide an acceptably high breakdown field to isolate logic functions from various power functions, as discussed above. Accordingly, complex processes using silicon dioxide are often used. However, silicon dioxide has a low thermal conductivity, which tends to exaggerate the carrier generation that occurs every high temperature environment.

Another way to obtain isolation in conventional semiconductors is to apply an etch process to the semiconductor material over an insulating substrate or semiconductor layer. However, etch processes, including plasma etch processes, induce surface damage and roughness in the etched semiconductor material, which may nevertheless be acceptable for a number of low power, conventional semiconductor devices typically realized in silicon. However, surface damage and roughness in the semiconductor material is particularly problematic for high power electronic devices where problems develop with surface breakdown and leakage currents between device structures.

Accordingly, it would be desirable to devise an isolation technique for semiconductor structures on a substrate or a semiconductor die that is simple and inexpensive to implement.

It is also desirable to obtain isolation without a number of additional steps or the use of additional materials or complexity.

Furthermore, it would be desirable to provide a technique for isolation that produces little or no damage to the semiconductor devices or underlying material.

It would also be desirable to obtain isolation for control and high voltage switching functions in a power IC composed of high band gap materials, including, for example, III-nitride materials.

SUMMARY OF THE INVENTION

According to the present invention, there is provided a fabrication technique and resulting structure for improving the isolation between low voltage and high voltage functions on a single monolithic IC. The isolation of low and high voltage functions can be achieved in accordance with the present invention through the use of wide band gap semiconductors, including, for example, III-nitride materials. For example, junction isolation can be achieved in such a monolithic IC with greatly improved performance, and without suffering the thermal penalties associated with junction isolation in silicon. For example, III-nitride semiconductor material produces very low carrier generation, even at high temperatures, making them highly suitable for use in junction isolation applications.

In accordance with another embodiment of the present invention, a high voltage isolation layer is provided for portions of components, components or semiconductor structures on a monolithic IC, and then etched to obtain the desired dielectric isolation. The isolation is formed with III-nitride materials, providing a high breakdown field associate with these wide band gap semiconductors.

In accordance with another feature of the present invention, a dielectric isolation layer may be provided that is relatively thin to permit the layer to be used in a planar process for fabrication of the monolithic IC. Accordingly, standard semiconductor fabrication equipment can be used to obtain a desired isolation between high voltage and low voltage functions on a single monolithic IC, with greatly improved performance without increasing costs.

According to another aspect of the present invention, a dielectric layer may be provided in a III-nitride material system, where the layer includes some percentage of GaN. According to another feature of the present invention, the dielectric layer may be grown epitaxially and include some percentage of GaN. According to another feature of the present invention, the dielectric layer may include some percentage of AlGaN. The use of AlGaN in the dielectric layer improves the isolation properties of the dielectric layer because AlGaN has a higher dielectric breakdown then, for instance, GaN. In addition, AlGaN has a high thermal conductivity, which further improves the construction of a monolithic IC with high and low voltage functionality separation by reducing or eliminating temperature increases or heat buildups between different functional blocks.

According to a feature of the present invention, there is provided a technique and resultant structure for isolating semiconductor structures, components and/or devices constructed on a single substrate or semiconductor die. In particular, III-nitride semiconductor material isolation can be achieved by masking or protecting the desired regions and applying an electrochemical or photo-electro-chemical (PEC) dopant selective etch. Selective material is removed by the etch to provide isolation using the semiconductor layer on which the device is produced.

In accordance with the present invention, intricate power device construction is possible to permit the formation of a monolithic IC with isolation between low voltage control electronics and high voltage power electronics with greatly improved performance. For example, a single wafer or die may include low voltage control electronics disposed atop an isolation layer with the isolation layer being etched to permit a connection to a high voltage layer, in which high voltage electronics are disposed. Typical structures for electronic connection may be provided, including electrodes and passivation layers.

Advantageously, cladding and contact layers may be grown above or below the active region. Other known processes for constructing electrodes, insulation layers and so forth may also be applied to the present invention.

According to another feature, the present invention provides a method for forming a III-nitride semiconductor structure, component and/or device on an insulative or highly resistive substrate. Optionally, a buffer layer may be provided between the substrate and a III-nitride body layer, which preferably includes some percentage of GaN. The buffer layer may also be composed of a III-nitride multilayer stack with alternating types of III-nitride materials to form a high current carrying region. A III-nitride layer with a smaller in-plane lattice constant than the underlying layer, and preferably including some percentage of AlGaN, is deposited over the body layer. The top layer may then be patterned and etched, to remove particular portions of the top III-nitride layer as desired. Ohmic and/or schottky contacts may be formed atop the smaller in-plane lattice constant III-nitride layer, with appropriate annealing steps to activate the ohmic contacts. Additional cladding or contact layers may be formed in a vertical or horizontal relationship with the active regions. For example, known processes for constructing electrodes and insulation layers may be applied in forming the III-nitride device. The etched areas through the top layer may be used for connections to high voltage electronic devices that may be disposed in the body or other layers below the body layer. The monolithic IC may then be passivated or otherwise completed according to known manufacturing methods.

The large dielectric breakdown field in the III-nitride semiconductor material system permits the construction of power devices with reduced size standoff regions. The material system also permits the production of devices with reduced specific on resistance in comparison with known devices of similar voltage ratings. Due to the higher performance of the III-nitride semiconductor material, in a smaller size than traditional materials, isolation performance takes on a greater importance. The device isolation provided according to the present invention can provide improved performance suitable for the III-nitride semiconductor materials, where such isolation was not needed or recognized in silicon semiconductors due to the lower electric fields generated by devices during operation.

The present invention is also characterized by low leakage currents and better resistance to surface breakdown. As a result, the present invention permits much denser construction of devices, potentially increasing wafer yields. The high critical fields of the III-nitride materials allow thin layers to withstand large voltages without dielectric breakdown. For example, the dielectric constant of GaN materials is approximately 10, which is a factor of 2.5 times better than silicon counterparts.

In accordance with another aspect of the present invention, a III-nitride semiconductor surface may be passivated or repassivated according to a self passivation effect. This technique may be used to enhance the isolation of devices according to the present invention.

The self passivation provides a high electric field breakdown. According to a feature of the present invention, the surface passivation includes a nitrogen plasma anneal. In accordance with another feature of the present invention, the passivation process includes using an encapsulant material containing nitrogen followed by an anneal. According to a further feature of the present invention, the passivation may be performed with a photo-electro-chemical etch.

According to another feature of the present invention, the selective etch applied to remove semiconductor material to provide isolation is a self terminating etch process. The etch process operates on selective material due to a difference in charge between the selected material and the material that is to remain after the etch process completes. Accordingly, the etch process is self terminated after all the selective material has been removed. This type of process permits greater control in establishing isolation, and permits the etch process to be used in a number of the sequences used to form III-nitride semiconductor structures. For example, the wafer surface may be appropriately patterned prior to the formation of the III-nitride device structure, and etched at that point or after the formation of the III-nitride device structure. In addition, the etch may be performed with little or no protection provided to the device, since the exposed portions of the device may not be effected by the selective etch.

Other features and advantages of the present invention will become apparent from the following description of the invention which refers to the accompanying drawings.

DETAILED DESCRIPTION OF THE PREFERRED EMBODIMENTS

Figure 1A:
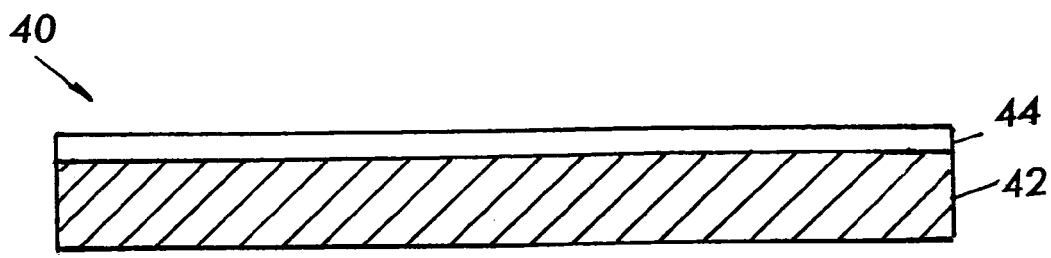
FIG. 1A is a cross-sectional view of a III-nitride material layer stack.

The advantages of III-nitride materials in conducting large amounts of current and withstanding high voltage are typically realized in a layer construction, although other types of constructions may readily be used in the III-nitride material system. Typically, two III-nitride material layers are used where each layer has a different percentage of III-nitride type material. For example, a layer with a percentage of GaN is overlaid with a composition with a percentage of AlGaN to form two layers with different in-plane lattice constants. The key is that a high mobility interface is formed between the two layers, to attain the advantages of high voltage blocking and high current conduction in devices constructed with the interface. Such devices find a number of uses in power electronic systems.

It is often the case that III-nitride material semiconductor structures, components and/or devices are formed on a wafer level, where a number of devices may be fabricated at the same time. In addition, monolithic ICs may be constructed on a wafer level. Accordingly, a substrate is often used as a base upon which the III-nitride semiconductor structures may be formed, where the structures are composed of a buffer layer and/or a body layer with different composition III-nitride materials. Often, portions of the body layer are overlaid with the III-nitride material having a different in-plane lattice constant, to form the desired high mobility conduction channel between the body layer and the overlaid barrier layer. When this operation occurs on wafer wide level, additional operations are often performed to provide the proper isolation between various structures constructed on the wafer.

In the present discussion, the term isolation is used to refer to a high resistance or non-conductive path between various structures, components or devices. That is, isolation may refer to various non-conductive paths in the same component, in a device composed of a number of components or in a number of devices in a circuit, such as on a monolithic IC. Isolation structures may be horizontal or vertical, and may be designed to have different voltage breakdown levels.

When a material layer is referred to in the present discussion, and in particular when the material layers as a III-nitride material layer, the layer may be composed of a percentage of GaN, AlN, InN, and/or various alloys of these nitrides, including AlGaN and InNAlGaN.

A technique for isolation previously used in the implementation of monolithic power ICs based on silicon technology use a form of isolation known as junction isolation. Junction isolation produces high leakage currents when exposed to high temperature environments caused by the thermal generation of carriers. According to the present invention, junction isolation structures may be formed using III-nitride materials to greatly improve the performance of the isolation in monolithic power ICs. Using the junction isolation technique, with III-nitride materials, great improvements can be realized in isolating low voltage control functions from high voltage switching functions. III-nitride materials do not generate large numbers of carriers when exposed to high temperatures and produce much better results when used in the construction of junction isolation structures.

The use of III-nitride materials can also improve isolation performance in the case of dielectric isolation used to separate the low voltage and high voltage functions in a monolithic power IC. III-nitride materials exhibit high breakdown fields and offer high performing dielectric isolation for use in the construction of monolithic power ICs. Accordingly, use of III-nitride materials avoids the need to provide a complex isolation technique or structure, as would be the case in previously known dielectrics, such as silicon dioxide. Due to the high thermal conductivity available in III-nitride materials, isolation for monolithic power ICs avoids the generation of excessive heat that may lead to increased generation of carriers through thermal action.

Referring now to FIG. 1A, a multi-layer structure composed of III-nitride materials is illustrated as structure 40. Structure 40 is composed of a first III-nitride material layer 42 and a second III-nitride material layer 44. Layer 44 acts as an isolation layer for structures, components or devices constructed on structure 40. According to an embodiment of the present invention, layer 44 may be grown epitaxially with particular percentages of selected III-nitride materials.

Figure 1B:
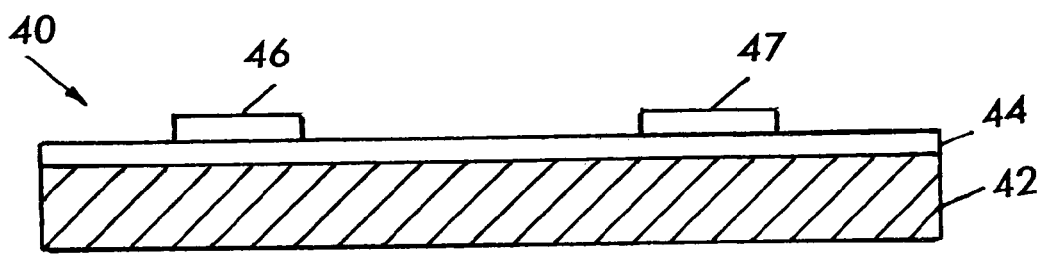
FIG. 1B is the stack of FIG. 1A further including III-nitride devices.

Referring now to FIG. 1B, low voltage control electronics 46, 47 are constructed atop layer 44. Electronics 46, 47 may represent various portions of a single component, individual structures, individual components, individual devices or various combinations thereof. For example, electronics 46 and 47 may be simple ohmic or schottky contacts, or may represent complete control circuits, such as motor control engines, filters, logic devices, and so forth. In each case, however, electronics 46, 47 are treated as being operable in a low voltage environment.

Figure 1C:
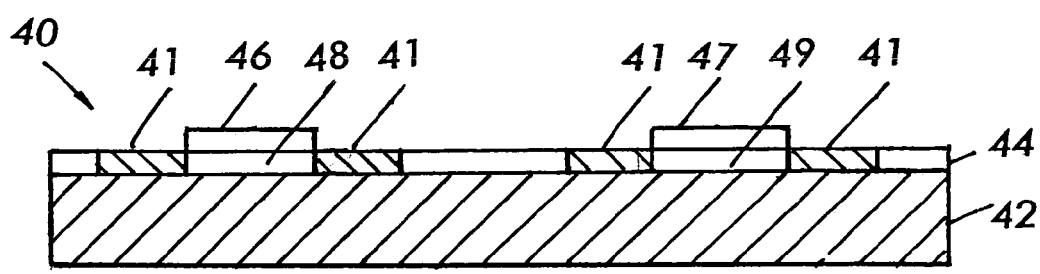
FIG. 1C is the stack of FIG. 1B including selectively doped material according to the present invention.

Referring now to FIG. 1C, structure 40 is processed to etch portions of layer 44 resulting in etched regions 41. Etched regions 41 provide areas for connection to high voltage electronics provided in layer 42. Regions 41 may also be used to provide isolation or patterning for other devices atop layer 44 or connected to layer 42, as specified for the application. Isolation areas 48, 49 remain after the etched process produces regions 41.

Figure 1D:
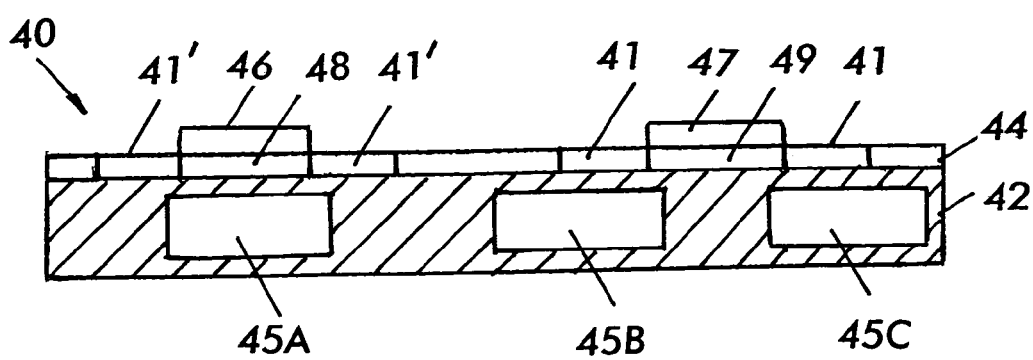
FIG. 1D is the stack of FIG. 1C with the doped material removed.

Referring now to FIG. 1D, structure 40 is illustrated with etched regions 41' for connection of electronics 46, 47 to high voltage electronic devices 45a–45c. Isolation layers 48, 49 provide high voltage isolation between electronics 46, 47 and high voltage electronics 45a–45c. Structure 40 accordingly represents a high voltage monolithic power IC with low voltage control functions isolated from high voltage electronics for use in high voltage switching applications. Isolation provided by layer 44 and regions 48, 49 have a significantly reduced leakage current over prior structures, while permitting portions of structure 40 to withstand high voltages without breakdown.

Layer 44 can be relatively thin and still provide dielectric isolation suitable for use in high voltage switching applications. By using a thin dielectric layer, structure 40 may be produced using a planar process for fabrication. Planar processes for fabrication utilize standard semiconductor fabrication equipment, meaning that structure 40 may be produced at a cost that does not differ significantly from that of prior devices constructed with silicon, although the performance of device 40 is greatly improved.

Layer 44 may be composed of dielectric material in the III-nitride material system, and may include percentages of AlGaN. For example, AlGaN can be inserted in certain percentages in the epitaxial growth of multi-layer structure 40 to form dielectric layer 44. Device 40 thus has an improved resistance area product (RA) and resistance charge product (RQ) that can be orders of magnitude better than silicon counterparts for the same current and voltage ratings. Due to the improved performance possible with III-nitride materials, device 40 can operate at higher speeds and can have smaller device geometry to realize further improvements in device operation. For example, the ability to scale down device geometry reduces capacitance and inductance observed in monolithic integration, to improve switching speeds and overall product performance.

The use of junction isolation structures with III-nitride materials results in breakdown voltages in excess of 450V according to experiments conducted in keeping with the present invention. In addition, experimental results for monolithic ICs constructed with III-nitride materials produce RA figures of merit for lateral devices that compare favorably with state of the art vertical silicon devices.

The ability to construct device 40 with planar processing techniques, due to the high voltage isolation possible with thin layers, enables a number of device geometries. For example, a hybrid lateral and vertical device may be constructed using planar and vertical processes with improved performance, such as may be observed in the operation of device 40.

The process for manufacturing device 40 is greatly simplified over prior art complex processes using silicon dioxide. Epitaxial growth may be used to create the isolation junctions for isolation dielectric regions to reduce processing complexity and improve thermal performance for the overall device. The epitaxial layers having different material component percentages form isolation and conduction regions depending upon the material content. Isolation layers are etched to permit connection with other layers to form complete circuits. Circuits constructed atop isolation layers remain protected from high voltage breakdown, while connections for control of high power devices is provided through etched areas of the isolation layer. In the performance of the etched process, it is desirable to remove the isolation material without damaging significant portions of the epitaxial structure. That is, it would be desirable to create a smooth surface with the etched process to avoid problems that otherwise may occur with rough surfaces in high voltage electronics.

Previously, a plasma etch process has been used to remove portions of III-nitride material in an isolation layer to permit connection to other layers. The plasma etch process removes enough III-nitride material to expose a conductive layer or connective pattern to permit connections with structures on an opposite side of the isolation layer.

One of the difficulties with the plasma etch process is the imprecision with which the process removes material from the substrate or die being processed. For example, the plasma etch process can induce surface damage and roughness in the material remaining after the etch process has removed the desired amount of material. The perimeter portions of the III-nitride device subjected to the plasma etch process accordingly has some induced surface damage and roughness, meaning that the crystalline structure is damaged and somewhat irregular. In previous applications, when III-nitride devices were used in low power applications, for example, the perimeter roughness or crystalline damage was inconsequential. However, for high power electronic devices, that are susceptible to surface breakdown and the generation of leakage currents, the damage to the crystalline structure and the surface roughness are highly undesirable. For instance, the roughness of material in the III-nitride high power electronic device may lead to the generation of high electric fields at the points of roughness, leading to surface breakdown and leakage currents in the device.

Figure 2A:
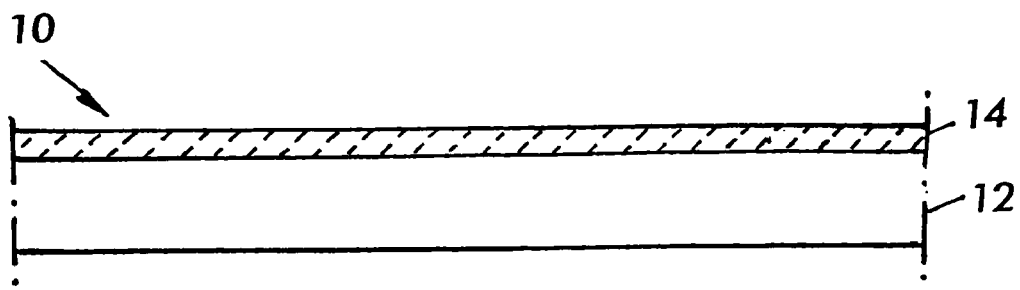
FIG. 2A is a cross-sectional view of a multi-layer structure composed of III-nitride materials.

Referring now to FIG. 2A, a structure and method is illustrated with respect to III-nitride material stack 10. Stack 10 includes a body layer 12 and an isolation layer 14. Stack 10 is representative of a typical III-nitride device, where body layer 12 may be composed of one or more layers of III-nitride material, or other composites or alloys, including substrates. Layer 12 may also be a composite layer with graded alloy material composed of any of the III-nitride materials, for example. Layer 12 may include a doped region for current conduction with an N or P-type doping. Alternately, or in addition, layer 12 may be composed of a highly resistive or insulative material that can act to prevent leakage currents or the propagation of electric fields that can lead to surface breakdown.

Layer 14 of stack 10 is composed of a percentage of a III-nitride material, and provides an isolation layer for later formed devices on stack 10.

Figure 2B:
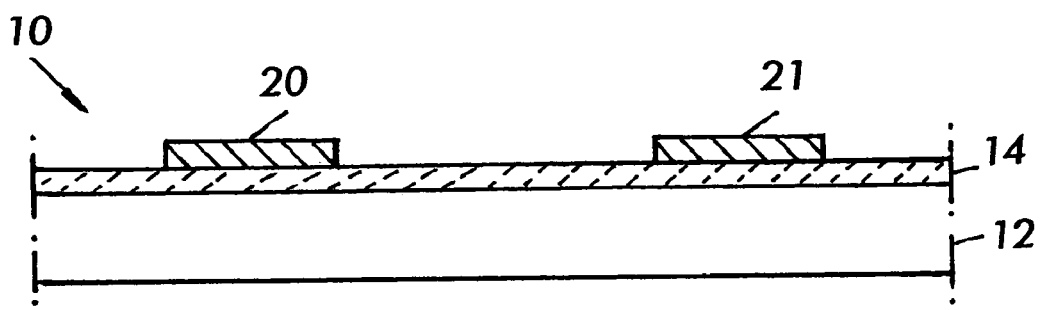
FIG. 2B shows the deposition of low voltage electronics on the structure of FIG. 2A.

Referring now to FIG. 2B, devices 20, 21 are constructed on layer 14. Any type of devices may be constructed and benefit from the present invention, including FETs, rectifiers, schottky diodes and so forth.

Figure 2C:
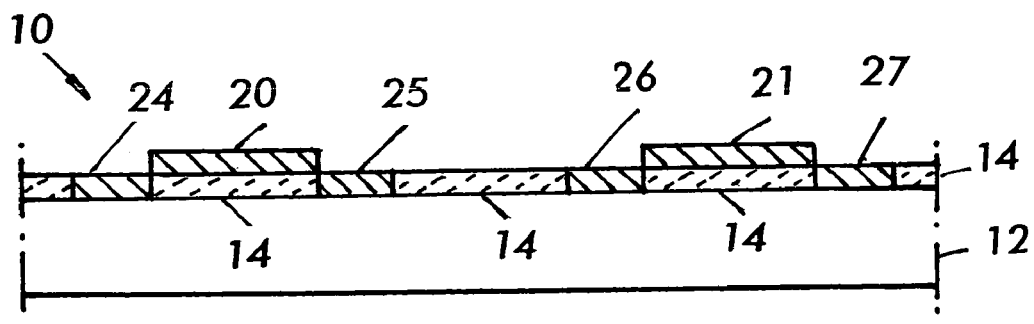
FIG. 2C shows selective etches in one of the layers of the structure of FIG. 2B.

Referring now to FIG. 2C, portions 24–27 of stack 10 are selectively marked for etching and removal. This step may be achieved according to a number of different techniques, including the use of a mask or a mask with an ion implantation, for example. The mask may be achieved according to a number of different techniques, and may include a protective layer over devices 20, 21.

Once portions 24–27 of stack 10 are selectively marked, a selective etch is applied to stack 10. The dopant selective etch targets portions 24–27 for removal, and etches those portions of layer 14. The applied etch process may be an electro-chemical etch, or a photo-electro-chemical etch. The etch process can be self stopping or terminating, where etching takes place only as long as the masked material remains in portions 24–27. Once all of the material in portions 24–27 has been etched, the etch process can automatically stop in the absence of any material. Through the use of this feature, a number of intricate structures can be constructed, where some portions would ordinarily have taken longer to etch, meaning that a longer etch process may cause damage to other, quickly etched portions of a wafer or die. Thus, the selective etch can be used in intricate patterns for a long period of time without causing damage to the remainder of the wafer or die structure.

Figure 2D:
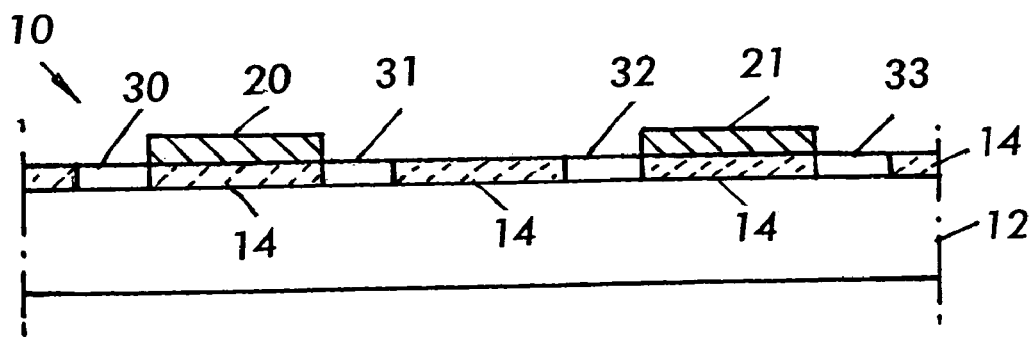
FIG. 2D shows the deposition of high voltage electronics in one of the layers of FIG. 2C.

Referring now to FIG. 2D, stack 10 includes voids 30–33 that are the result of the removal of portions 24–27 using the selective etch. Voids 30–33 provide connection pathways for devices 20–21 to layer 12.

Portions of layer 14 remaining intact after the selective etch provide a good dielectric isolation between devices 20, 21 and layer 12 to permit high voltage isolation for stack 10. The etch process leaves a smooth surface along the surfaces of voids 30–33, so that stack 10 is less susceptible to high voltage breakdown. Because the crystalline structure of layer 14 is largely undamaged, it retains superior isolation qualities. Accordingly, it is possible to provide layer 14 as a thin layer, while still retaining good dielectric properties.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A monolithic power IC, comprising:
   a low voltage section having low voltage electronics for realizing control functions;
   a high voltage section having high voltage electronics for high voltage switching functions;
   an isolation structure between a low voltage electronics and the high voltage electronics for isolating the low voltage electronics from the high voltage electronics;
   the isolation structure further permitting connectivity between the low voltage section and the high voltage section, wherein the isolation structure is composed of wide band gap semiconductor material.

2. The IC according to claim 1, wherein the wide band gap material includes a component selected from group consisting of column III-nitrides.

3. The IC according to claim 2, wherein the isolation structure includes one or more of a material selected from the group consisting of GaN, AlN, InN, and alloys thereof.

4. The IC according to claim 1, wherein the isolation structure includes a junction isolation structure.

5. The IC according to claim 4, wherein the junction isolation structure exhibits a breakdown voltage greater than 450V.

6. The IC according to claim 4, wherein the junction isolation structure includes a III-nitride semiconductor PN junction.

7. The IC according to claim 1, wherein the isolation structure includes dielectric isolation.

8. The IC according to claim 1, wherein the isolation structure is a planar structure.

9. The IC according to claim 1, wherein the isolation structure includes an epitaxial layer.

10. The IC according to claim 9, wherein the epitaxial layer includes a percentage of GaN.

11. The IC according to claim 9, wherein the epitaxial layer includes a percentage of AlGaN.

12. The IC according to claim 9, further comprising electronic device structures with epitaxial layers grown with the epitaxial dielectric layer.

13. The IC according to claim 1, wherein the high voltage section has a relatively low resistance area product.

14. The IC according to claim 1, wherein the isolation structure includes a dielectric isolation layer incorporating a percentage of a material selected from the group consisting of column III-nitrides.

15. The IC according to claim 14, wherein the dielectric isolation layer exhibits the characteristics of a good thermal conductor.

16. The IC according to claim 1, further comprising lateral and vertical device geometries.

* * * * *